(12) United States Patent
Park et al.

(10) Patent No.: US 11,594,818 B2
(45) Date of Patent: Feb. 28, 2023

(54) ELECTRONIC APPARATUS

(71) Applicant: Samsung Display Co., Ltd., Yongin-Si (KR)

(72) Inventors: Yong-Han Park, Hwaseong-si (KR); Young-Ran Son, Seoul (KR); Hyunjung Kim, Seongnam-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 214 days.

(21) Appl. No.: 17/160,869

(22) Filed: Jan. 28, 2021

(65) Prior Publication Data
US 2021/0280975 A1    Sep. 9, 2021

(30) Foreign Application Priority Data

Mar. 6, 2020 (KR) .................. 10-2020-0028534

(51) Int. Cl.
*H01Q 7/00* (2006.01)
*H01L 27/32* (2006.01)

(52) U.S. Cl.
CPC ........... *H01Q 7/00* (2013.01); *H01L 27/3244* (2013.01); *H01L 2251/5338* (2013.01)

(58) Field of Classification Search
CPC ...... H01Q 7/00; H01Q 1/243; H01L 27/3244; H01L 2251/5338; H01L 27/3225; H01L 27/3276; H04M 1/0266; H04M 1/026; H04M 1/0249; G06F 1/1698; G06F 1/1613; G06F 1/1626
See application file for complete search history.

(56) References Cited

U.S. PATENT DOCUMENTS

| | | | |
|---|---|---|---|
| 9,543,364 B2* | 1/2017 | Rappoport | H04R 1/028 |
| 9,922,618 B2* | 3/2018 | Prendergast | G06F 3/0443 |
| 10,381,750 B2* | 8/2019 | Jung | H01Q 1/44 |
| 10,609,826 B2 | 3/2020 | Choi et al. | |
| 2015/0309626 A1* | 10/2015 | Prendergast | G06F 3/0445 345/173 |
| 2021/0134927 A1* | 5/2021 | Kim | H01Q 1/38 |

FOREIGN PATENT DOCUMENTS

| | | |
|---|---|---|
| CN | 208401899 U | 1/2019 |
| KR | 1020170059527 A | 5/2017 |
| KR | 1020190019802 A | 2/2019 |
| KR | 101973742 B1 | 4/2019 |
| KR | 1020190089578 A | 7/2019 |

* cited by examiner

*Primary Examiner* — Dimary S Lopez Cruz
*Assistant Examiner* — Michael M Bouizza
(74) *Attorney, Agent, or Firm* — Cantor Colburn LLP

(57) ABSTRACT

An electronic apparatus includes a display module including a display area through which an image is displayed and a non-display area adjacent to the display area and provided with a through hole through which a signal is transmitted, which is defined in the display area, an electronic module disposed under the display module, overlapping the through hole, and transmitting or receiving the signal, and an antenna module disposed on the display module and including a first portion through which an opening corresponding to the through hole is defined and a second portion extending from the first portion and inserted into the through hole.

19 Claims, 12 Drawing Sheets

ELECTRONIC APPARATUS

This application claims priority to Korean Patent Application No. 10-2020-0028534, filed on Mar. 6, 2020, and all the Korean Intellectual Property Office accruing therefrom under 35 U.S.C. § 119, the content of which in its entirety is herein incorporated by reference.

BACKGROUND

1. Field

Embodiments of the invention relate to an electronic apparatus. More particularly, embodiments of the invention relate to an electronic apparatus having improved antenna placement efficiency.

2. Description of the Related Art

An electronic apparatus includes electronic modules. The electronic apparatus is a mobile terminal or a wearable device, for example, and the electronic modules include an antenna module, a camera module, or a battery module.

SUMMARY

As a mobile terminal becomes thinner and a wearable device becomes smaller, a space for the electronic modules gradually decreases. In addition, as an electronic apparatus becomes highly functional with high specifications, a number of electronic modules included in the electronic apparatus increases.

Embodiments of the invention provide an electronic apparatus having an antenna placement efficiency that is improved by a dead space in a display area thereof.

Embodiments of the invention provide an electronic apparatus including a display module including a display area through which an image is displayed and a non-display area adjacent to the display area and provided with a through hole through which a signal is transmitted, which is defined in the display area, an electronic module disposed under the display module, overlapping the through hole, and transmitting or receiving the signal, and an antenna module disposed on the display module and including a first portion through which an opening corresponding to the through hole is defined and a second portion extending from the first portion and inserted into the through hole.

In an embodiment, a circular hole overlapping the opening may be defined in the second portion.

In an embodiment, the second portion may extend along a sidewall of the through hole by a length in a thickness direction of the display module.

In an embodiment, the antenna module may include a radio frequency element disposed on the first portion and a transmission line disposed on the second portion.

In an embodiment, the radio frequency element may include a loop antenna which surrounds the opening, and opposite ends of the loop antenna may be connected to the transmission line.

In an embodiment, the antenna module may include a loop antenna which surrounds the opening, and the loop antenna may be disposed on the first portion and extend to the second portion.

In an embodiment, the electronic apparatus further may include a window disposed on the display module and including a transmission area corresponding to the display area and a bezel area corresponding to the non-display area.

In an embodiment, the window may include a surface facing the display module and defining a signal transmission area overlapping the through hole, and a light blocking pattern may be disposed on the surface of the window.

In an embodiment, the first portion may overlap the light blocking pattern.

In an embodiment, the first portion may be spaced apart from the display module in a thickness direction.

In an embodiment, the second portion may overlap a portion of the light blocking pattern in a plan view.

Embodiments of the invention provide an electronic apparatus including a window, a display module including a display area through which an image is displayed and a non-display area adjacent to the display area and provided with a plurality of through holes through which a signal is transmitted, which is defined in the display area, an electronic module disposed under the display module, overlapping the plurality of through holes, and transmitting or receiving the signal, and an antenna module disposed between the display module and the window and including a radio frequency element which overlaps at least a portion of a plurality of openings defined respectively corresponding to the plurality of through holes and a transmission line extending from the radio frequency element and inserted into the plurality of through holes.

In an embodiment, the window may include a light blocking pattern that defines a plurality of signal transmission areas respectively overlapping the plurality of through holes, and the radio frequency element may overlap the light blocking pattern.

In an embodiment, the radio frequency element may include a loop antenna which surrounds at least a portion of the plurality of openings.

In an embodiment, the radio frequency element may include a first radio frequency element and a second radio frequency element, and the transmission line may include a first transmission line extending from the first radio frequency element and a second transmission line extending from the second radio frequency element.

In an embodiment, the first radio frequency element and the second radio frequency element may have different frequency bands from each other.

In an embodiment, the electronic apparatus may further include an antenna driving module that connects the first transmission line and the second transmission line.

In an embodiment, the display module may include a first surface facing the window and a second surface opposite to the first surface, and the antenna driving module may be disposed between the plurality of through holes on the second surface.

In an embodiment, the plurality of openings may include a first opening and a second opening, the radio frequency element may include a loop antenna which surrounds the first and second openings, a first end of the loop antenna may extend to the first opening, and a second end of the loop antenna may extend to the second opening.

According to the above, the electronic apparatus includes the antenna disposed in a dead space around the through hole for the camera of the display panel. Thus, the antenna placement efficiency may be improved in spatial and functional aspects.

BRIEF DESCRIPTION OF THE DRAWINGS

The above and other advantages of the invention will become readily apparent by reference to the following detailed description when considered in conjunction with the accompanying drawings wherein.

DETAILED DESCRIPTION

Figure 1A:
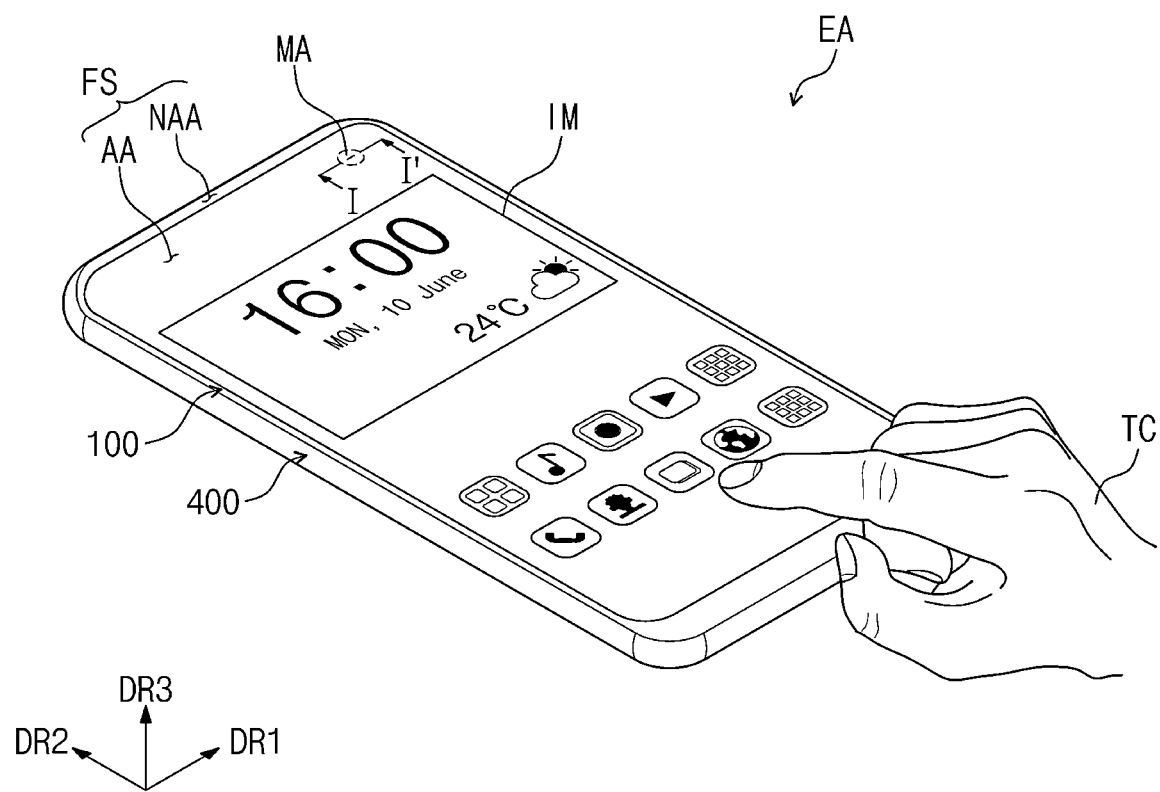
FIGS. 1A and 1B are perspective views showing an embodiment of electronic apparatuses according to the invention.

In the disclosure, it will be understood that when an element or layer is referred to as being "on", "connected to" or "coupled to" another element or layer, it can be directly on, connected or coupled to the other element or layer or intervening elements or layers may be present.

Like numerals refer to like elements throughout. In the drawings, the thickness, ratio, and dimension of components are exaggerated for effective description of the technical content. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the disclosure. As used herein, the singular forms, "a", "an" and "the" are intended to include the plural forms as well, unless the context clearly indicates otherwise.

Spatially relative terms, such as "beneath", "below", "lower", "above", "upper" and the like, may be used herein for ease of description to describe one element or feature's relationship to another element(s) or feature(s) as illustrated in the drawing figures.

It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

In the description, the term "module" or "unit" may mean a part including at least one circuit for performing a predetermined operation.

Hereinafter, the invention will be explained in detail with reference to the accompanying drawings.

Figure 1B:
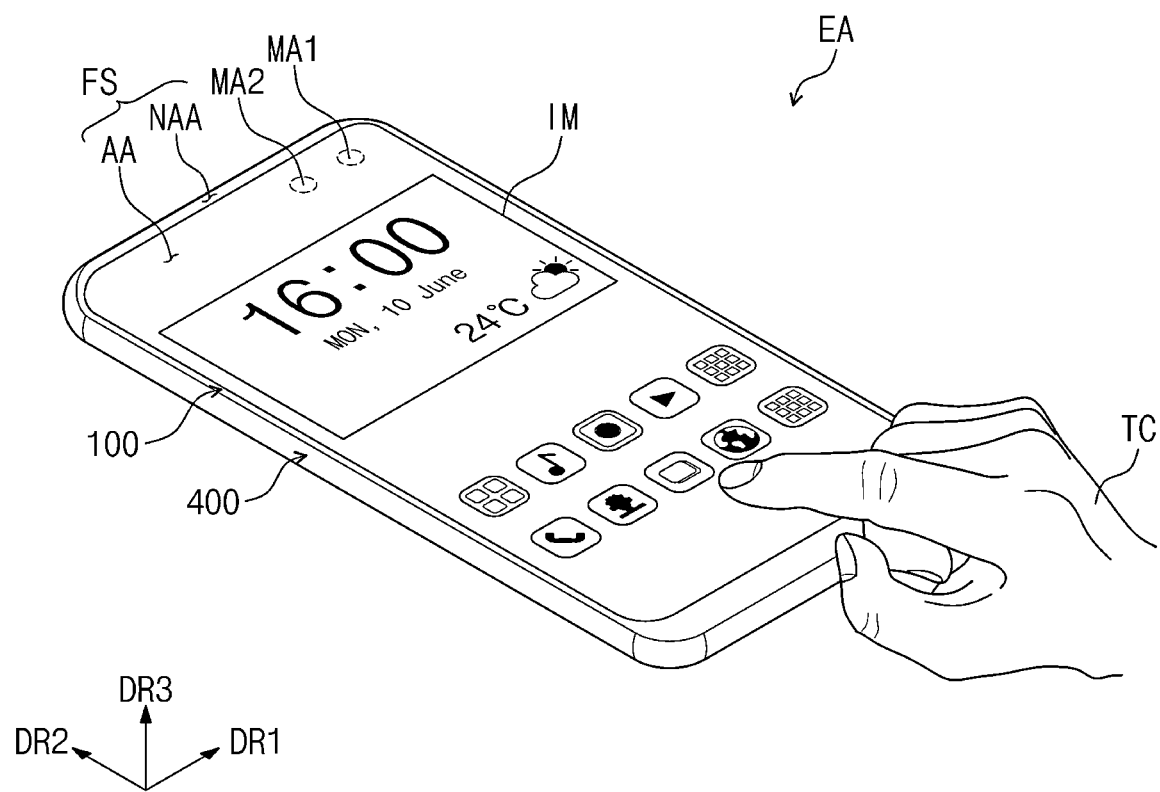
Figure 2:
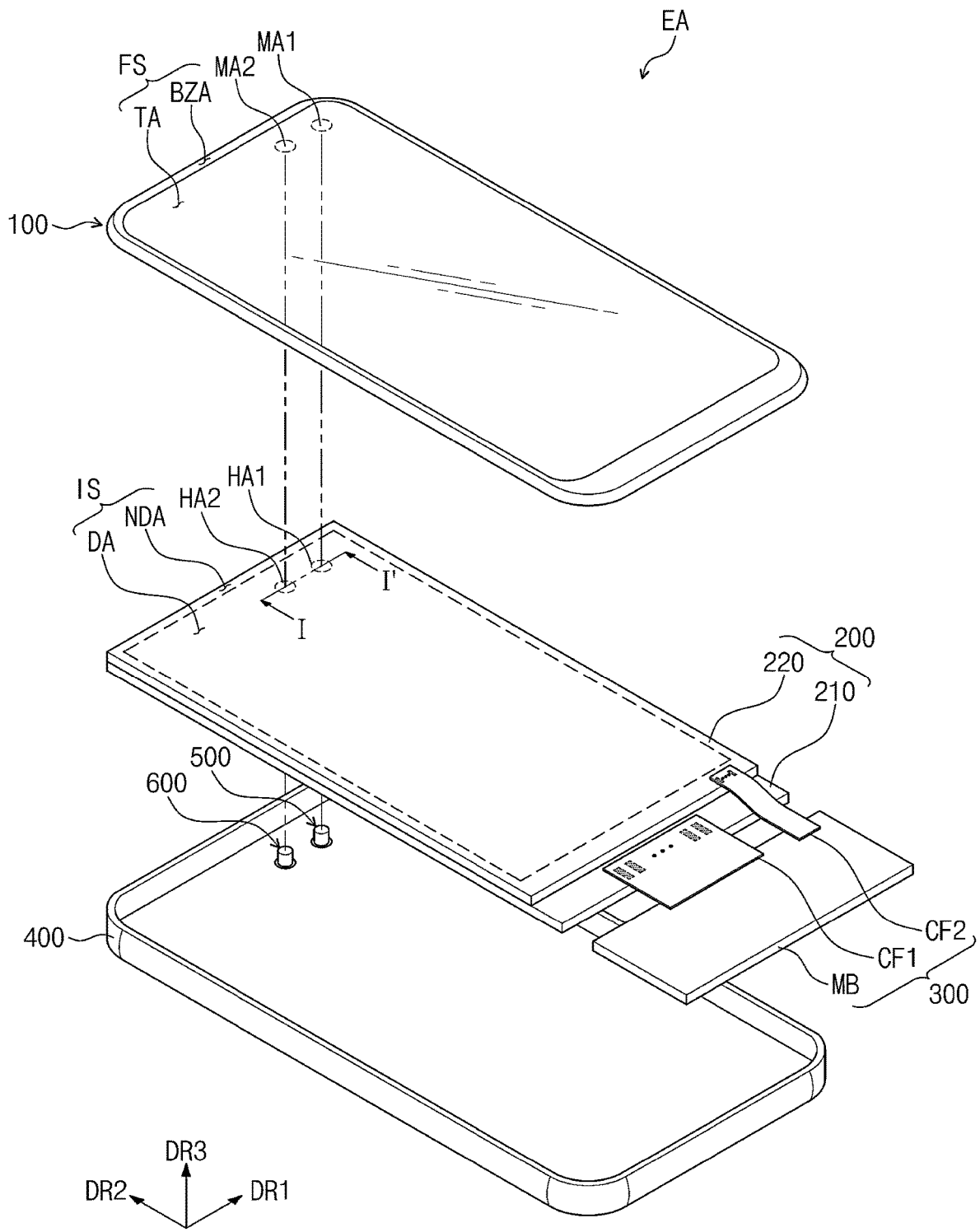
FIG. 2 is an exploded perspective view showing an embodiment of an electronic apparatus according to the invention.
Figure 3:
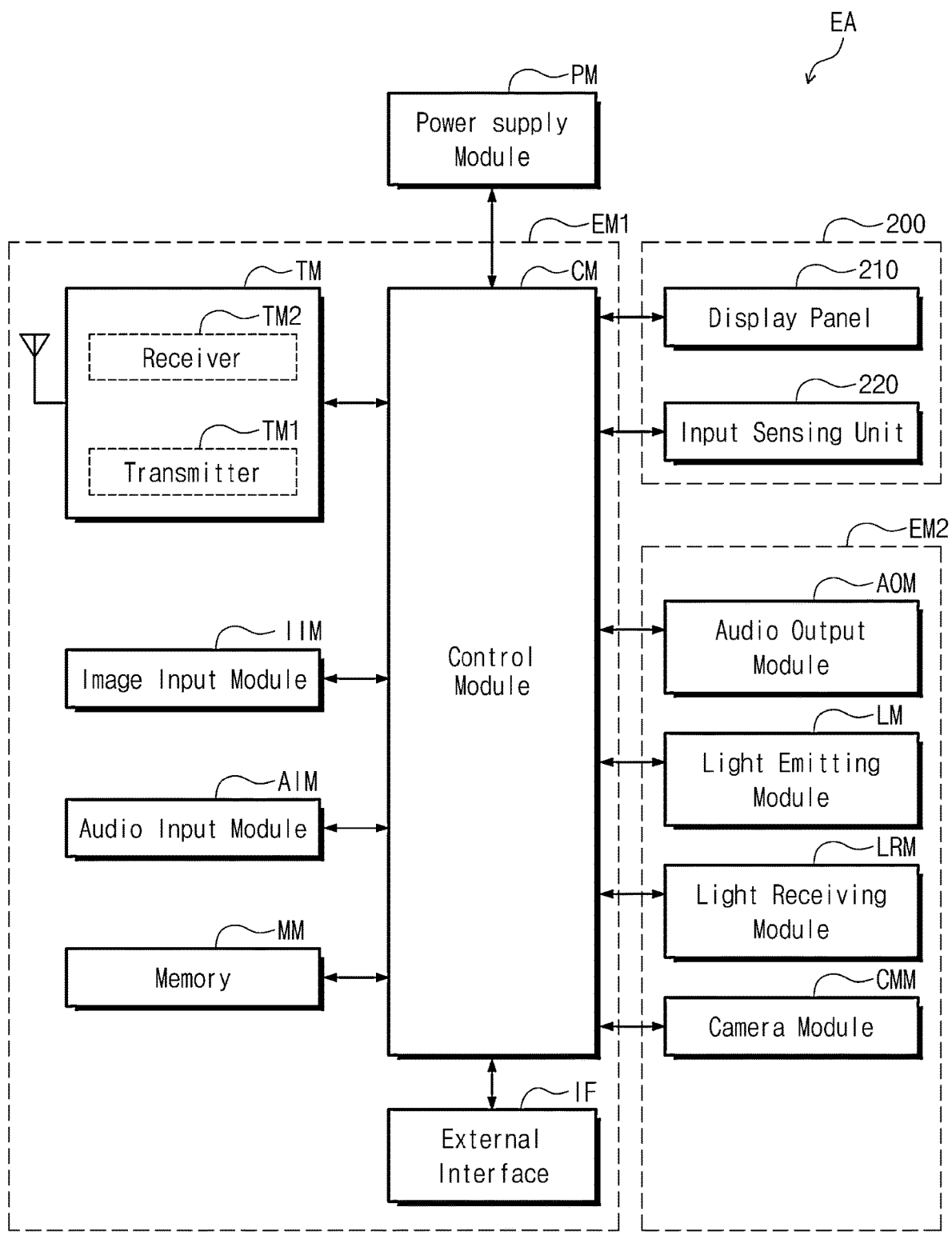
FIG. 3 is a block diagram showing an embodiment of an electronic apparatus according to the invention.

FIGS. 1A and 1B are perspective views showing an embodiment of electronic apparatuses EA according to the invention. FIG. 2 is an exploded perspective view showing an embodiment of an electronic apparatus EA according to the invention. FIG. 3 is a block diagram showing an embodiment of the electronic apparatus EA according to the invention.

Referring to FIGS. 1A to 3, the electronic apparatus EA may be activated in response to electrical signals to display an image. The electronic apparatus EA may be a tablet computer, a notebook computer, a computer, or a television set. In the illustrated embodiment, a smart phone will be described as a representative example of the electronic apparatus EA.

The electronic apparatus EA may display an image IM toward a third direction DR3 through a display surface FS that is substantially parallel to each of a first direction DR1 and a second direction DR2. The display surface FS through which the image IM is displayed may correspond to a front surface of the electronic apparatus EA and a front surface of a window 100. Hereinafter, the display surface and the front surface of the electronic apparatus EA and the front surface of the window 100 are assigned with the same reference numeral. The image IM includes a still image as well as a motion image. FIGS. 1A and 1B show a clock widget and application icons as a representative example of the image IM.

In the illustrated embodiment, front (or upper) and rear (or lower) surfaces of each member are defined with respect to a direction in which the image IM is displayed. The front and rear surfaces are opposite to each other in the third direction DR3, and a normal line direction of each of the front and rear surfaces is substantially parallel to the third direction DR3. Directions indicated by the first, second, and third directions DR1, DR2, and DR3 are relative to each other, and thus, the directions indicated by the first, second, and third directions DR1, DR2, and DR3 may be changed to other directions.

The electronic apparatus EA may include the window 100, a display module 200, a driving circuit unit 300, a housing 400, a first electronic module 500, and a second electronic module 600. In an embodiment, the module may include at least one circuits. In the illustrated embodiment, the window 100 and the housing 400 may be coupled to each other to form an exterior of the electronic apparatus EA. The electronic apparatus EA may include an active area AA displaying the image IM and a non-active area NAA surrounding the active area AA.

The window 100 may include an optically transparent insulating material. In an embodiment, the window 100 may include glass or plastic, for example. The window 100 may have a single-layer or multi-layer structure. In an embodiment, the window 100 may include a plurality of plastic films attached to each other by an adhesive or may include a glass substrate and a plastic film attached to the glass substrate by an adhesive, for example.

The window 100 may be divided into a transmission area TA and a bezel area BZA in a plan view. In the invention, the expression "in a plan view" may mean a state of being viewed in the third direction DR3. In addition, the expression "thickness direction" may mean the third direction DR3.

The transmission area TA may be an optically transparent area. The bezel area BZA may be an area having a light transmittance relatively lower than that of the transmission area TA. The bezel area BZA may define a shape of the transmission area TA. The bezel area BZA may be adjacent to the transmission area TA and may surround the transmission area TA.

The bezel area BZA may have a predetermined color. The bezel area BZA may cover a non-active area NAA of the display module 200 to prevent the non-active area NAA from being viewed from the outside. However, this is merely exemplary, and the bezel area BZA may be omitted in another embodiment of the window 100 according to the invention.

Referring to FIG. 1A, the electronic apparatus EA may include a module area MA. Referring to FIG. 1B, the electronic apparatus EA may include a plurality of module areas MA1 and MA2. In an embodiment, the electronic apparatus EA may include a first module area MA1 and a second module area MA2. The module area MA or the first module area MA1 may overlap the first electronic module 500, for example. The electronic apparatus EA may receive external signals for the first electronic module 500 or may apply signals output from the first electronic module 500 to the outside through the first module area MA1. According to an embodiment of the invention, the first module area MA1 may overlap the transmission area TA. Accordingly, a size of the bezel area BZA may be reduced by an area providing the first module area MA1 in the bezel area BZA. In the embodiment of the invention, the second module area MA2 may overlap the second electronic module 600. The electronic apparatus EA may receive external signals for the second electronic module 600 or may apply signals output from the second electronic module 600 to the outside through the second module area MA2. In an embodiment, the first electronic module 500 and the second electronic module 600 may include a camera module, a sensor module, and the like, for example.

In FIGS. 1A, 1B, and 2, the first and second module areas MA1 and MA2 are defined in a right upper end of the active area AA, however, they should not be limited thereto or thereby. That is, the first and second module areas MA1 and MA2 may be defined in various areas, such as a left upper end of the active area AA, a center of the active area AA, a left lower end of the active area AA, or a right lower end of the active area AA.

As shown in FIG. 2, the display module 200 may be disposed under the window 100. In the disclosure, the term "under" may mean a direction opposite to the direction in which the display module 200 displays the image IM. The display module 200 may display the image IM and may sense an external input TC. The display module 200 may include a front surface IS including a display area DA and a non-display area NDA. The display area DA may be activated in response to electrical signals.

In the invention, the display area DA may be the area in which the image IM is displayed and the external input TC is sensed. The transmission area TA may overlap at least the display area DA. In an embodiment, the transmission area TA may overlap at least a portion or entire portion of the display area DA, for example. Therefore, a user may view the image IM through the transmission area TA or may input the external input TC through the transmission area TA.

The non-display area NDA may be covered by the bezel area BZA. The non-display area NDA may be adjacent to the display area DA. The non-display area NDA may surround the display area DA. A driving circuit or a driving line may be disposed in the non-display area NDA to drive the display area DA.

In the illustrated embodiment, the display module 200 has a flat shape in the display area DA and the non-display area NDA as a representative example, however, the shape of the display module 200 should not be limited thereto or thereby. In an embodiment, the display module 200 may be partially bent in the non-display area NDA, for example. In this case, the display module 200 may be bent toward a rear surface of the electronic apparatus EA in the non-display area NDA, and thus, the size of the bezel area BZA may be reduced in the front surface of the electronic apparatus EA. In another embodiment, the display module 200 may have a partially-bent shape in the display area DA. In another embodiment, the non-display area NDA may be omitted in the display module 200 according to the invention.

The display module 200 may include a display panel 210 and an input sensing unit 220.

The display panel 210 may substantially generate the image IM. The image IM generated by the display panel 210 may be displayed through the front surface IS of the display module 200 and viewed by the user from the outside through the transmission area TA.

The input sensing unit 220 may sense the external input TC provided from the outside. In an embodiment, the input sensing unit 220 may sense the external input TC provided through the window 100. The external input TC may be a user input, for example. In an embodiment, the user input may include various forms of external inputs, such as a portion of the user's body, light, heat, pen, or pressure. In the illustrated embodiment, the external input TC is shown as a touch operation using the user's hand applied via the display surface FS of the electronic apparatus EA, however, this is merely exemplary. As described above, the external input TC may be provided in various forms, the electronic apparatus EA may sense the external input TC applied to a side or rear surface of the electronic apparatus EA depending on a structure of the electronic apparatus EA, and it should not be limited to a particular embodiment.

The driving circuit unit 300 may be electrically connected to the display panel 210 and the input sensing unit 220. The driving circuit unit 300 may include a main circuit board MB, a first flexible film CF1, and a second flexible film CF2.

The first flexible film CF1 may be electrically connected to the display panel 210. The first flexible film CF1 may connect the display panel 210 and the main circuit board MB. The first flexible film CF1 may be connected to pads (display pads) of the display panel 210, which are arranged in the non-active area NAA. The first flexible film CF1 may provide electrical signals to the display panel 210 to drive the display panel 210. The electrical signals may be generated by the first flexible film CF1 or the main circuit board MB.

The second flexible film CF2 may be electrically connected to the input sensing unit 220. The second flexible film CF2 may connect the input sensing unit 220 and the main circuit board MB. The second flexible film CF2 may be connected to pads (sensing pads) of the input sensing unit 220, which are arranged in the non-active area NAA. The second flexible film CF2 may provide electrical signals to the input sensing unit 220 to drive the input sensing unit 220. The electrical signals may be generated by the second flexible film CF2 or the main circuit board MB.

The main circuit board MB may include various driving circuits used to drive the display module 200 or a connector used to supply a power. The first flexible film CF1 and the second flexible film CF2 may be connected to the main circuit board MB. According to the invention, the display module 200 may be easily controlled by one main circuit board MB, however, this is merely exemplary. In another embodiment of the display module 200 according to the invention, the display panel 210 and the input sensing unit 220 may be connected to different main circuit boards from each other, and one of the first flexible film CF1 and the second flexible film CF2 may not be connected to the main circuit board MB, however, they should not be limited to a particular embodiment.

In the embodiment of the invention, an area of the display module 200 corresponding to the first and second module areas MA1 and MA2 may have a relatively higher transmittance than that of the display area DA that does not overlap the first and second module areas MA1 and MA2. This is because at least some of components of the display panel 210 and the input sensing unit 220 may be omitted from the area of the display module 200 corresponding to the first and second module areas MA1 and MA2. Accordingly, the first electronic module 500 and the second electronic module 600 which overlap the first and second module areas MA1 and MA2, respectively, may easily transmit and/or receive signals through the first and second module areas MA1 and MA2.

In FIG. 2, through holes through which a signal is transmitted may be defined in an area of the display module 200 corresponding to the module areas MA1 and MA2. The through holes may be classified into a first through hole HA1 and a second through hole HA2. In the embodiment, the first through hole HA1 and the second through hole HA2 may be defined in the display area DA to penetrate through the display module 200. The display panel 210 and the input sensing unit 220 may be penetrated by the first through hole HA1 and the second through hole HA2. That is, the first through hole HA1 and the second through hole HA2 may be defined by removing all components of the display panel 210 and the input sensing unit 220, which respectively overlap the first module area MA1 and the second module area MA2. As the first through hole HA1 and the second through hole HA2 are defined in the display area DA, the first module area MA1 and the second module area MA2 may be defined in the active area AA.

In a plan view, the first electronic module 500 may overlap the first through hole HA1 and the first module area MA1. The first electronic module 500 may be disposed under the display module 200, and at least a portion of the first electronic module 500 may be accommodated in the first through hole HA1. The first electronic module 500 may receive the external input provided through the first through hole HA1 or may output signals through the first through hole HA1.

The second electronic module 600 may overlap the second through hole HA2 and the second module area MA2. The second electronic module 600 may be disposed under the display module 200. The second electronic module 600 may be accommodated in the second through hole HA2. In an embodiment, the second electronic module 600 may emit optical signals to the outside through the second through hole HA2, for example.

The housing 400 may be coupled to the window 100. The housing 400 coupled to the window 100 may provide an inner space. The display module 200 and the first electronic module 500 may be accommodated in the inner space.

The housing 400 may include a material with a relatively high rigidity. In an embodiment, the housing 400 may include a plurality of frames and/or plates including glass, plastic, metal, or a combination thereof, for example. The housing 400 may stably protect the components of the electronic apparatus EA, which are accommodated in the inner space, from external impacts.

Referring to FIG. 3, the electronic apparatus EA may include the display module 200, a power supply module PM, a first module EM1, and a second module EM2. The display module 200, the power supply module PM, the first module EM1, and the second module EM2 may be electrically connected to each other.

The power supply module PM may supply a power necessary for the overall operation of the electronic apparatus EA. The power supply module PM may include a conventional battery module.

The first module EM1 and the second module EM2 may include various functional modules to operate the electronic apparatus EA.

The first module EM1 may be disposed (e.g., mounted) directly on a mother board electrically connected to the display module 200 or may be electrically connected to the mother board through a connector (not shown) after being disposed (e.g., mounted) on a separate board.

The first module EM1 may include a control module CM, a wireless communication module TM, an image input module IIM, an audio input module AIM, a memory MM, and an external interface IF. Some of the modules may be electrically connected to the mother board through a flexible printed circuit board without being disposed (e.g., mounted) on the mother board.

The control module CM may control the overall operation of the electronic apparatus EA. The control module CM may be, but not limited to, a microprocessor. In an embodiment, the control module CM may activate or deactivate the display module 200, for example. The control module CM may control other modules, e.g., the image input module IIM or the audio input module AIM, based on a touch signal provided from the display module 200. The control module CM may receive user's gaze information from the first electronic module 500. In an embodiment, the control module CM may control other modules based on the user's gaze information. In an embodiment, the control module CM may control the display panel 210, the power supply module PM, and the input sensing unit 220 based on the user's gaze information, for example.

The wireless communication module TM may transmit/receive a wireless signal to/from another terminal by a Bluetooth or Wi-Fi link. The wireless communication module TM may transmit/receive a voice signal by a conventional communication line. The wireless communication module TM may include a transmitter TM1 that modulates a signal to be transmitted and transmits the modulated signal and a receiver TM2 that demodulates the signal applied thereto.

The image input module IIM may process an image signal and may convert the image signal into image data that may be displayed through the display module 200. The audio input module AIM may receive an external audio signal through a microphone in a recording mode and a voice recognition mode and may convert the audio signal into electrical voice data.

The external interface IF may serve as an interface between the control module CM and external devices, such as an external charger, a wired/wireless data port, and a card socket (e.g., a memory card and a subscriber identification module/user identity module ("SIM/UIM") card).

The second module EM2 may include an audio output module AOM, a light emitting module LM, a light receiving module LRM, and a camera module CMM. The components of the second module EM2 may be disposed (e.g., mounted) directly on the mother board, electrically connected to the display module 200 through a connector (not shown) after being disposed (e.g., mounted) on a separate board, or electrically connected to the first module EM1.

The audio output module AOM may convert and output the audio data provided from the wireless communication module TM or the audio data stored in the memory MM to the outside.

The light emitting module LM may generate and emit a light. The light receiving module LRM may be activated when an infrared ray at a predetermined level or higher is sensed. The light receiving module LRM may include a complementary metal oxide semiconductor ("CMOS") sensor. The infrared ray generated by the light emitting module LM may be incident into the light receiving module LRM after being output from the light emitting module LM and being reflected by an external object, e.g., a user's finger or face. The camera module CMM may photograph an external image.

In an embodiment, the first electronic module 500 in the embodiment of the invention may include the camera module CMM and the light receiving module LRM. The second electronic module 600 may include the light emitting module LM, for example. The second electronic module 600 may emit the signal through the second module area MA2 and the second through hole HA2. The first electronic module 500 may sense an external signal provided through the first module area MA1 and the first through hole HA1 or may receive the signal reflected by a predetermined object after being emitted through the second electronic module 600. Each of the first electronic module 500 and the second electronic module 600 may be provided in plural.

Figure 4:
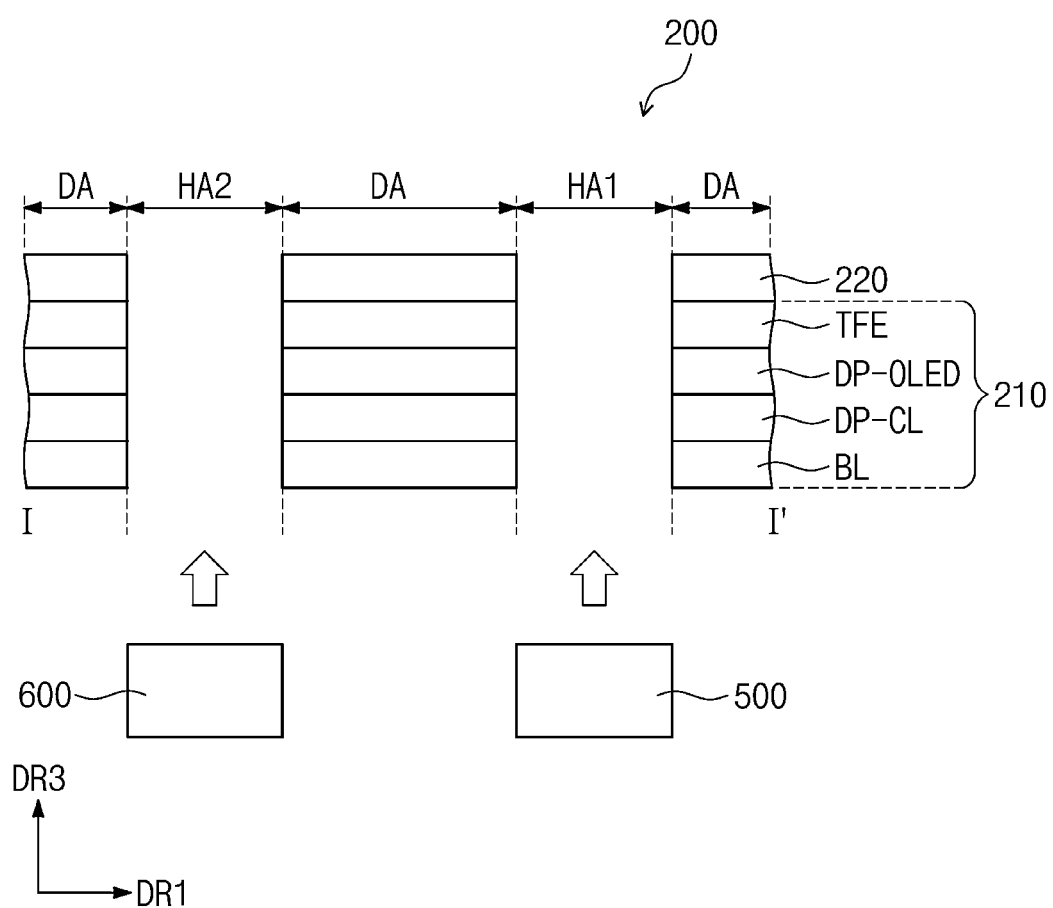
FIG. 4 is a cross-sectional view showing an embodiment of a display module according to the invention.

FIG. 4 is a cross-sectional view showing an embodiment of the display module 200 according to the invention. FIG. 4 is a cross-sectional view showing the display module 200 that is a flexible type display module. In the case of a rigid type display module, unlike the flexible type display module in the embodiment of the invention, the first through hole HA1 and the second through hole HA2 do not completely penetrate through the rigid type display module. The electronic apparatus EA of the invention may basically include the flexible type display module 200.

FIG. 4 shows a cross-section taken along line I-I' of FIG. 2.

Referring to FIG. 4, the flexible type display panel 210 may include a base layer BL, a circuit element layer DP-CL disposed on the base layer BL, a display element layer DP-OLED disposed on the circuit element layer DL-CL, and a thin film encapsulation layer TFE.

The base layer BL may include a glass substrate. The base layer BL may include a substrate having a constant refractive index in a visible light wavelength range. The circuit element layer DP-CL may include at least one insulating layer and a circuit element. The circuit element layer DP-CL may include at least a transistor. Hereinafter, the insulating layer of the circuit element layer DP-CL may include at least one inorganic layer and/or at least one organic layer. The circuit element may include a signal line and a pixel driving circuit. The display element layer DP-OLED may include at least a light emitting element. The display element layer DP-OLED may include organic light emitting diodes as the light emitting element. The display element layer DP-OLED may include a pixel definition layer, e.g., an organic material. The thin film encapsulation layer TFE may encapsulate the display element layer DP-OLED. The thin film encapsulation layer TFE may include at least one insulating layer. The thin film encapsulation layer TFE in an embodiment of the invention may include at least one inorganic layer (hereinafter, also referred to as an "encapsulation inorganic layer"). The thin film encapsulation layer TFE in an embodiment of the invention may include at least one organic layer (hereinafter, also referred to as an "encapsulation organic layer") and at least one encapsulation inorganic layer. The encapsulation inorganic layer may protect the display element layer DP-OLED from moisture and oxygen, and the encapsulation organic layer may protect the display element layer DP-OLED from a foreign substance, such as dust particles. In an embodiment, the encapsulation inorganic layer may include a silicon nitride layer, a silicon oxynitride layer, a silicon oxide layer, a titanium oxide layer, or an aluminum oxide layer, for example, however, it should not be limited thereto or thereby. In an embodiment, the encapsulation organic layer may include an acrylic-based organic layer, for example, however, it should not be particularly limited.

The display module 200 may include the first through hole HA1 and the second through hole HA2, which correspond to high transmittance areas and are defined in the display area DA. Different from a closed rigid-type display module 200, the first through hole HA1 and the second through hole HA2 of the flexible-type display module 200 are an open type, and thus, openings may be defined in the first through hole HA1 and the second through hole HA2.

The input sensing unit 220 may be disposed on the display panel 210. In an embodiment, the input sensing unit 220 may be disposed directly on the display panel 210 or may be coupled to the display panel 210 by an adhesive member, for example. The input sensing unit 220 may be disposed on the display panel 210 through a successive process after the display panel 210 is provided.

Figure 5A:
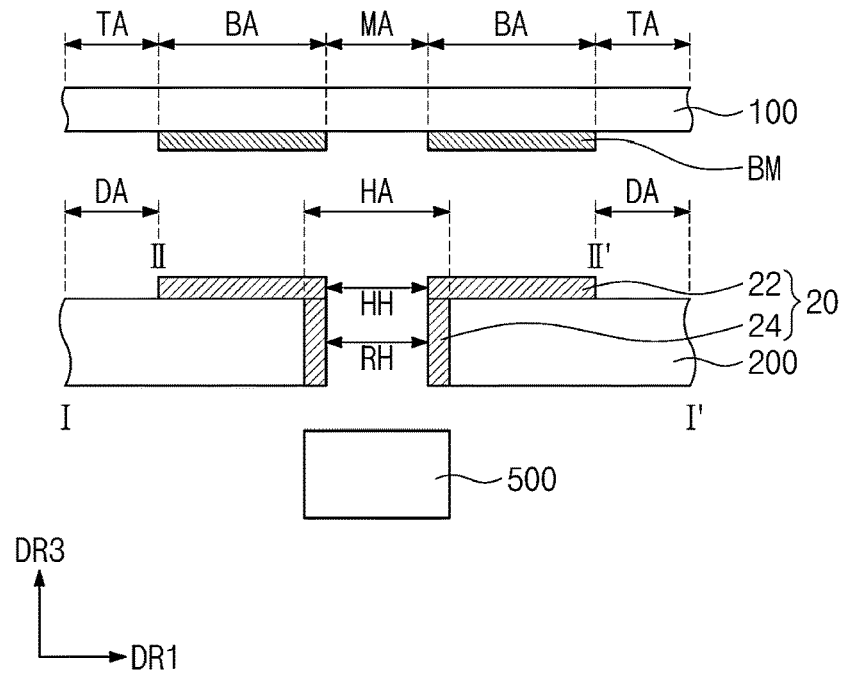
FIGS. 5A and 5B are cross-sectional views showing an embodiment of an electronic apparatus according to the invention.
Figure 5B:
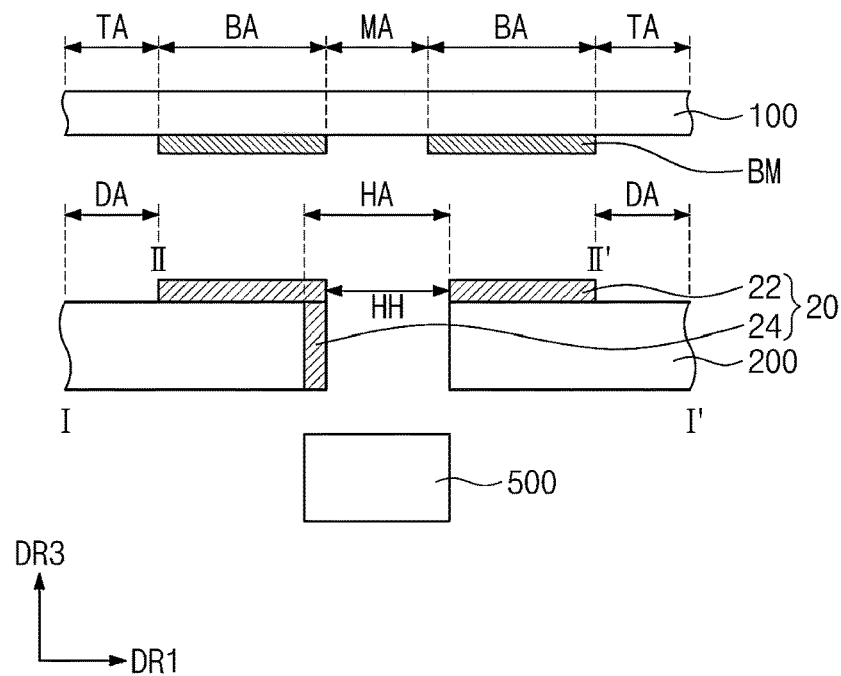

FIGS. 5A and 5B are cross-sectional views showing an embodiment of the electronic apparatus according to the invention. FIGS. 5A and 5B show cross-sections taken along line I-I' of FIG. 1A.

Referring to FIGS. 5A and 5B, the electronic apparatus EA may include the window 100, the display module 200 including the display panel 210 (refer to FIG. 4), the first electronic module 500 disposed under the display module 200, and an antenna module 20.

The window 100 may be disposed above the display module 200. The window 100 may include a rear surface facing the display module 200 and a front surface opposite to the rear surface. The window 100 may include a light blocking pattern BM disposed on the rear surface thereof. The light blocking pattern BM may define a signal transmission area MA. The signal transmission area MA may be also referred to as the "module area MA". The signal transmission area MA may overlap a through hole HA of the display module 200. In the embodiment, the light blocking pattern BM may have a single-layer structure of a black color. The light blocking pattern BM may be provided in the single-layer structure with a substantially small thickness to reduce a step difference between the window 100 and the display module 200, which is caused by the arrangement of the antenna module 20. The light blocking pattern BM may define a light blocking area BA on the window 100. The light blocking area BA may be surrounded by the transmission area TA, and the module area MA (or the signal transmission area) may be defined at a center portion of the light blocking area BA.

The display module 200 may include the display panel 210 and may include the display area DA through which the image is displayed and the non-display area NDA (refer to FIG. 2) adjacent to the display area DA. The through hole HA through which the signal is transmitted may be defined in the display module 200 in the display area DA.

The first electronic module 500 may be disposed under the display module 200 and may overlap the through hole HA. In an embodiment, as the first electronic module 500, a variety of electronic devices that transmit or receive signals, e.g., the camera module, may be provided.

The antenna module 20 may include a first portion 22 and a second portion 24. The antenna module 20 may be disposed on the display module 200. The first portion 22 of the antenna module 20 may be provided with an opening HH defined therethrough. The second portion 24 may extend from the first portion 22 and may be inserted and disposed in the through hole HA. In the embodiment, a circular hole RH may be defined through the second portion 24 and may overlap the opening HH. Signals emitted from the first electronic module 500 may pass through the through hole through the circular hole RH of the second portion 24 and the opening HH of the first portion 22 and may be transmitted to the signal transmission area MA of the window 100.

In the embodiment, the second portion 24 of the antenna module 20 may extend along a sidewall of the through hole HA. The second portion 24 may extend entirely along the opening HH of the first portion 22 and may be disposed along an inner sidewall of the through hole HA. The second portion 24 may extend along the sidewall by a length in a thickness direction of the display module 200. That is, a length of the second portion 24 may be the same as a thickness of the display module 200 in the third direction DR3.

In the embodiment, the first portion 22 may overlap the light blocking pattern BM of the window 100. The first portion 22 may be disposed under the light blocking pattern BM in the thickness direction, and thus, the first portion 22 may not be recognized by a user on the surface of the window 100. In this case, the thickness direction may correspond to the third direction DR3.

In the embodiment, the second portion 24 may overlap a portion of the light blocking pattern BM. In the case where the second portion 24 overlaps the light blocking pattern BM, the second portion 24 may not be observed by the user on the surface of the window 100.

Referring to FIG. 5B, the second portion 24 of the antenna module 20 may overlap a portion of an inner sidewall of the through hole HA in the first direction DR1. In an embodiment, the second portion 24 may extend from a portion of the first portion 22 and may be disposed along one surface of the inner sidewall of the through hole HA, for example.

Figure 6:
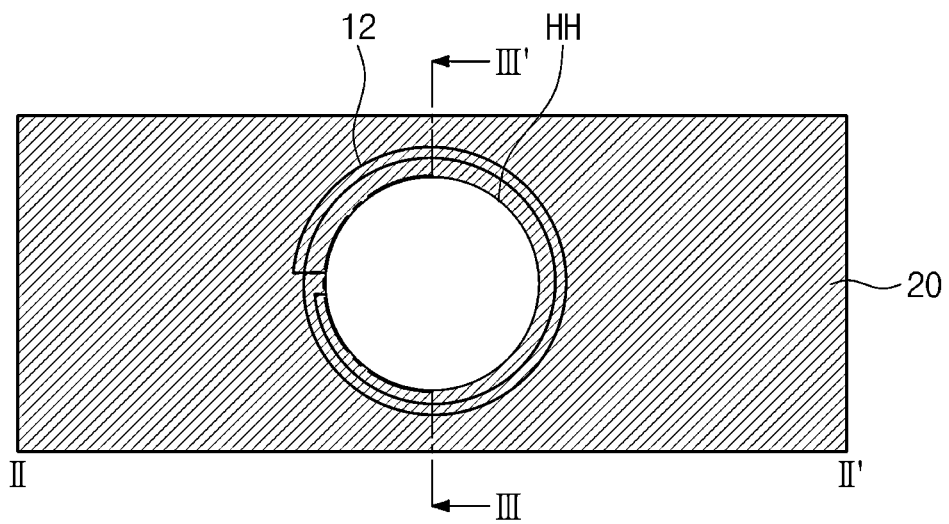
FIG. 6 is a plan view showing an embodiment of an antenna module according to the invention.
Figure 6:
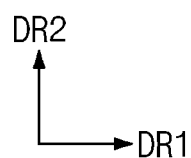

FIG. 6 is a plan view showing an embodiment of the antenna module 20 according to the invention. FIG. 6 is a plan view showing an area indicated by II and II' of FIG. 5A or 5B.

Referring to FIG. 6, the antenna module 20 may include a radio frequency element 12. The radio frequency element 12 may be a circular-loop antenna surrounding the opening HH of the first portion. The radio frequency element 12 may be wound twice around the opening HH as shown in drawing figures, however, it should not be limited thereto or thereby. The radio frequency element 12 may be wound around the opening HH three or more times. Opposite ends, i.e., one end and the other end, of the radio frequency element 12 may extend to the opening HH.

Figure 7A:
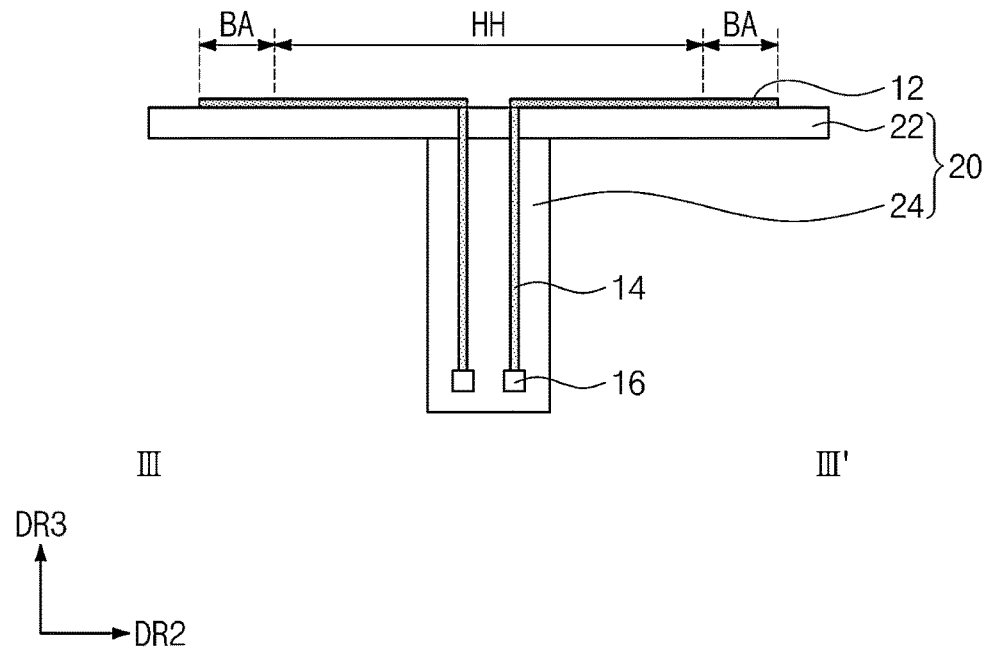
FIGS. 7A and 7B are cross-sectional views showing an embodiment of antenna modules according to the invention.
Figure 7B:
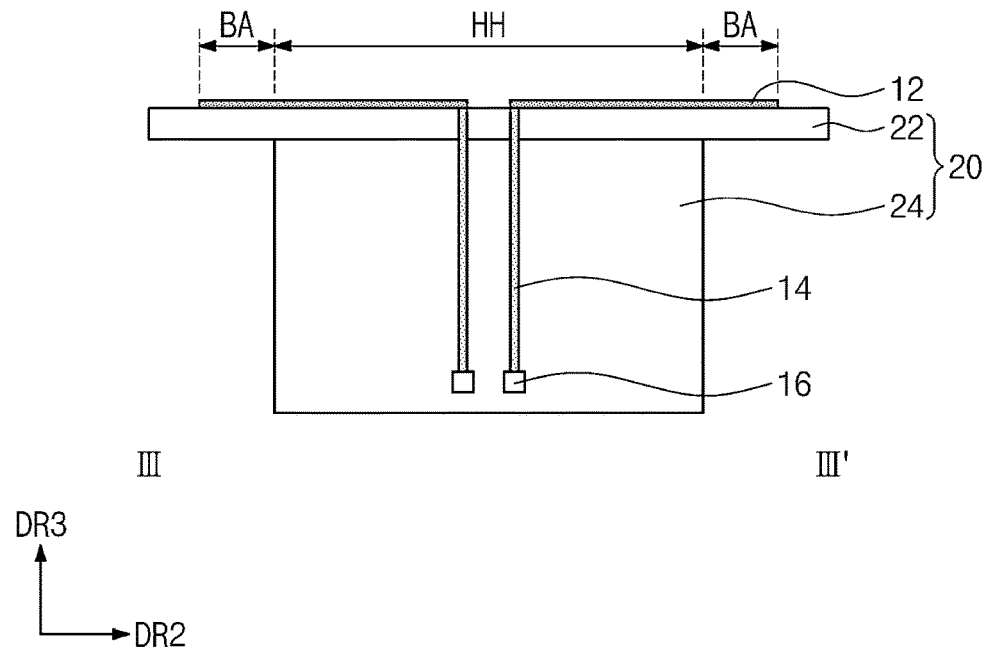

FIGS. 7A and 7B are cross-sectional views showing an embodiment of antenna modules according to the invention. FIGS. 7A and 7B are cross-sectional views taken along line III-III' of FIG. 6.

Referring to FIGS. 7A and 7B, the antenna module 20 may include the radio frequency element 12 disposed on the first portion 22 and a transmission line 14 disposed on the second portion 24. The radio frequency element 12 may be disposed on the first portion 22 and may have an arrangement as shown in FIG. 6. The radio frequency element 12 is shown briefly in drawing figures. The opposite ends of the radio frequency element 12 may be connected to the transmission line 14. The transmission line 14 may be connected to a pad 16. The pad 16 may connect the radio frequency element 12 to an antenna driving module (not shown).

Referring to FIG. 7A, the second portion 24 may extend from a portion of the first portion 22 and may be inserted into the through hole HA. Referring to FIG. 7B, the second portion 24 may extend from the first portion 22 entirely along the opening HH and may define the circular hole RH. The transmission line 14 may be disposed along the second portion 24 and may transmit desired electrical signals to the radio frequency element 12.

In the embodiment, the first portion 22 of the antenna module 20 may be disposed on the display module 200 and may be provided as a substrate including the radio frequency element 12. The second portion 24 may extend from the first portion 22 and may be provided as a substrate or wiring line that is inserted into the through hole HA. The second portion 24 may include the transmission line 14 and may or may not include an antenna.

Figure 8A:
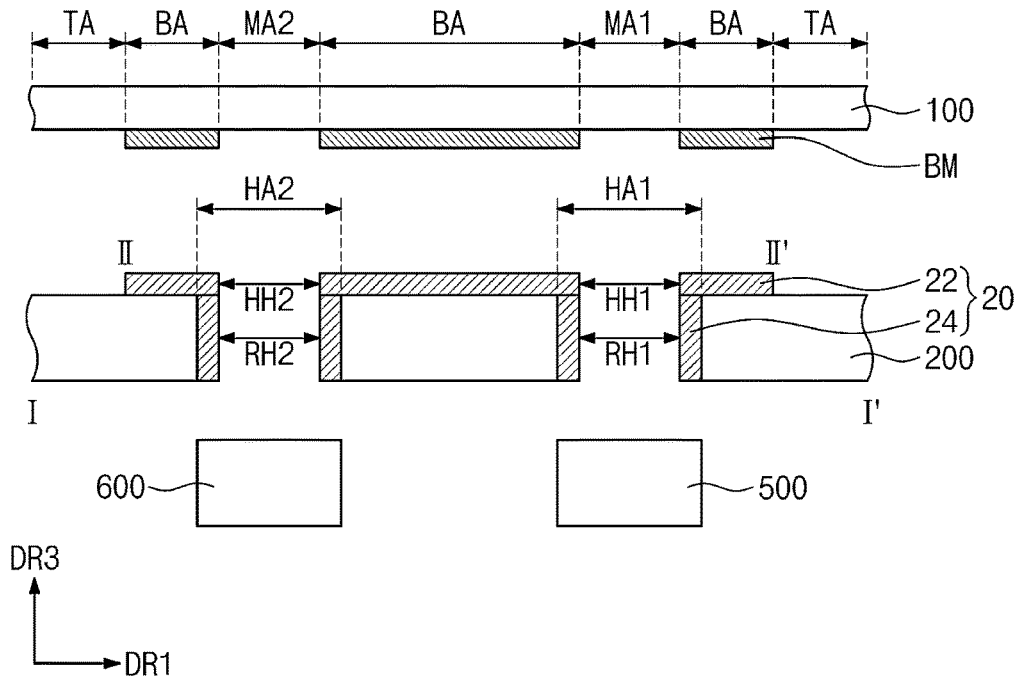
FIGS. 8A and 8B are cross-sectional views showing an embodiment of electronic apparatuses according to the invention.
Figure 8B:
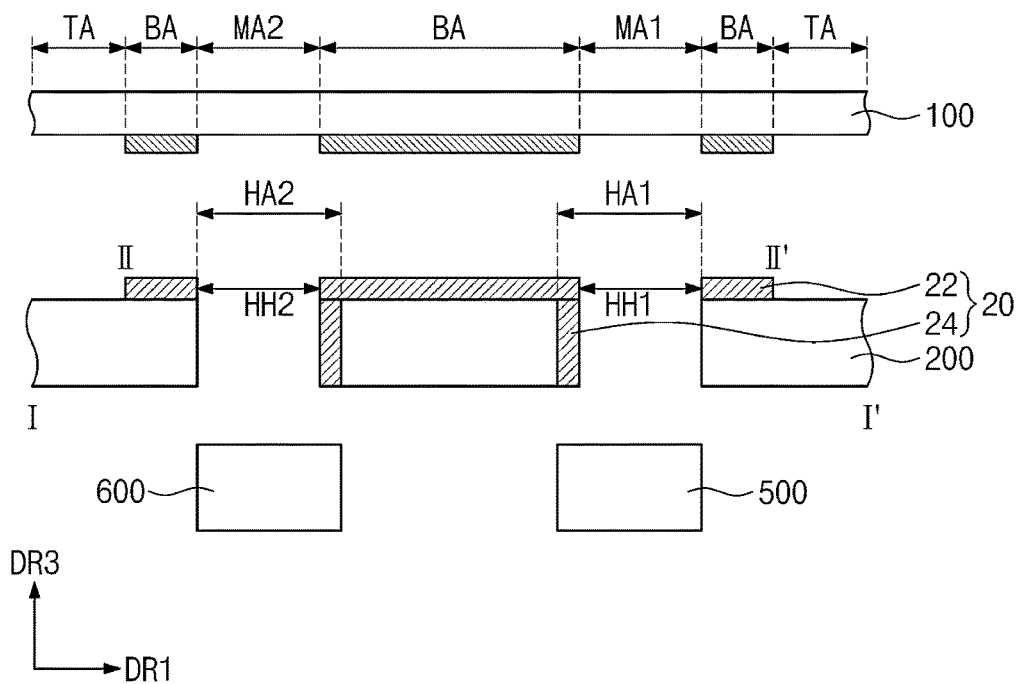

FIGS. 8A and 8B are cross-sectional views showing an embodiment of electronic apparatuses according to the invention.

Referring to FIGS. 8A and 8B, each electronic apparatus EA may include the window 100, the display module 200, the first electronic module 500, the second electronic module 600, and the antenna module 20.

The display module 200 may include a plurality of through holes. The through holes may include the first through hole HA1 and the second through hole HA2.

The window 100 may include the light blocking pattern that defines a plurality of signal transmission areas overlapping the through holes. In the embodiment, the window 100 may include a first signal transmission area MA1 and a second signal transmission area MA2, which respectively overlap the first and second through holes HA1 and HA2. In this case, the first signal transmission area MA1 may be also referred to as the first module area MA1, and the second signal transmission area MA2 may be also referred to as the second module area MA2.

The first electronic module 500 and the second electronic module 600 may be disposed under the display module 200 and may respectively overlap the first through hole HA1 and the second through hole HA2.

The antenna module 20 may define a plurality of openings overlapping the through holes. In the embodiment, the antenna module 20 may include a first portion 22 provided with a first opening HH1 defined therethrough to correspond to the first through hole HA1 and a second opening HH2 defined therethrough to correspond to the second through hole HA2. The antenna module 20 may include a second portion 24 that extends from the first portion 22 and is inserted into the first and second through holes HA1 and HA2.

In the embodiment, the second portion 24 may extend from a portion of the first portion 22 and may be disposed along one inner surface of the first through hole HA1 and/or the second through hole HA2. Referring to FIG. 8B, the second portion 24 may be disposed along one inner surface of the first through hole HA1 and one inner surface of the second through hole HA2, which are adjacent to each other.

In the embodiment, a first circular hole RH1 overlapping the first opening HH1 and a second circular hole RH2 overlapping the second opening HH2 may be defined through the second portion 24. In the case where the antenna module 20 extends from the first portion 22 entirely along the first and second openings HH1 and HH2, the first and second circular holes RH1 and RH2 may be defined through the second portion 24.

In the embodiment, the second portion 24 may correspond to a portion of the antenna module 20 extending from the first portion 22 and being inserted into the first and/or second through holes HA1 and/or HA2, and the radio frequency element (refer to 12-1 and 12-2 in FIG. 9A and 12-2 in FIG. 9B) or the transmission line 14 (refer to FIGS. 7A and 7B) may not be necessarily disposed in the second portion 24. In an embodiment, the second portion 24 of FIG. 8B extends along the inner sidewall of the first and second through holes HA1 and HA2, for example, however, the transmission line 14 (refer to FIGS. 7A and 7B) may be disposed only on the second portion 24 disposed inside the second through hole HA2.

Figure 9A:
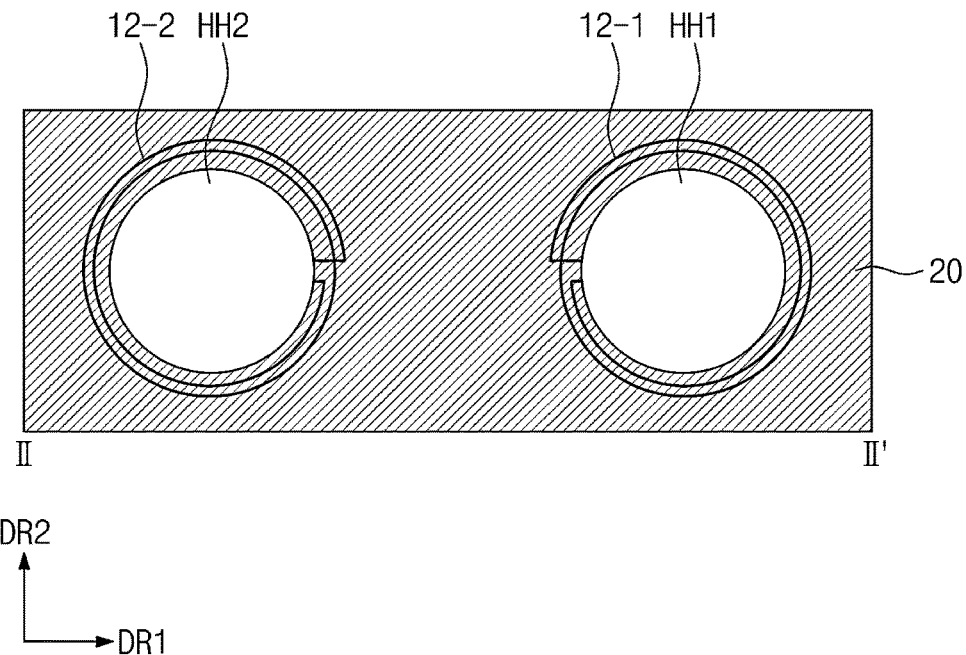
FIGS. 9A and 9B are plan views showing an embodiment of antenna modules according to the invention.
Figure 9B:
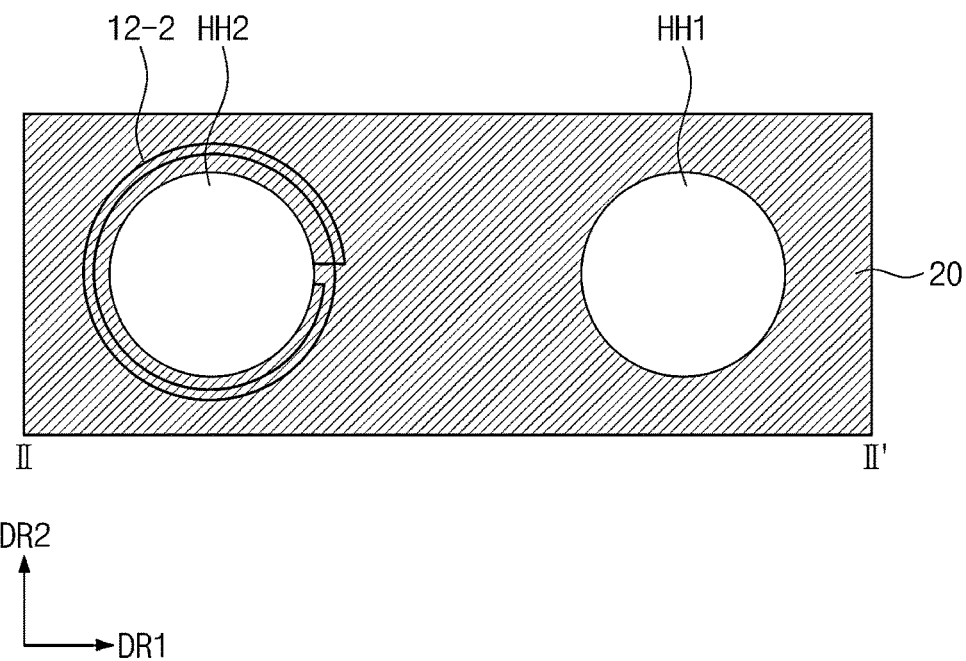

FIGS. 9A and 9B are plan views showing an embodiment of antenna modules according to the invention. FIGS. 9A and 9B are plan views showing areas indicated by II and II' of FIGS. 8A and 8B.

Referring to FIGS. 9A and 9B, the antenna module 20 may include a radio frequency element 12-1 and 12-2 adjacent to at least a portion of the openings. The radio frequency element 12-1 and 12-2 may be disposed on the first portion 22. The antenna module 20 may include the transmission line 14 (refer to FIGS. 7A and 7B) extending from the radio frequency element 12-1 and 12-2 and inserted into the through holes. Referring to FIG. 9A, the antenna module 20 may include a first radio frequency element 12-1 which surrounds the first opening Mil and a second radio frequency element 12-2 which surrounds the second opening HH2. FIG. 9A shows only the first and second openings HH1 and HH2, however, third and fourth openings may be further provided. In the embodiment, the first radio frequency element 12-1 and the second radio frequency element 12-2 may have different frequency bands from each other. In an embodiment, the first radio frequency element 12-1 may have a frequency band of about 28 gigahertz (GHz), and the second radio frequency element 12-2 may have a frequency band of about 39 GHz, for example.

The radio frequency element 12-1 and 12-2 may overlap the light blocking pattern BM (refer to FIG. 8A).

In the embodiment, the antenna module 20 may include the radio frequency element 12-1 and 12-2 adjacent to one of the first opening HH1 and the second opening HH2. FIG. 9B shows the antenna module 20 including only the second radio frequency element 12-2 which surrounds the second opening HH2 as a representative example. In an embodiment, the radio frequency element 12-1 and 12-2 may include a loop antenna, for example.

In the embodiment, the antenna module 20 may include a first transmission line (not shown) extending from the first radio frequency element 12-1 and a second transmission line (not shown) extending from the second radio frequency element 12-2. The first and second transmission lines may be disposed on the second portion 24 as the transmission line 14 of FIGS. 7A and 7B.

Figure 10:
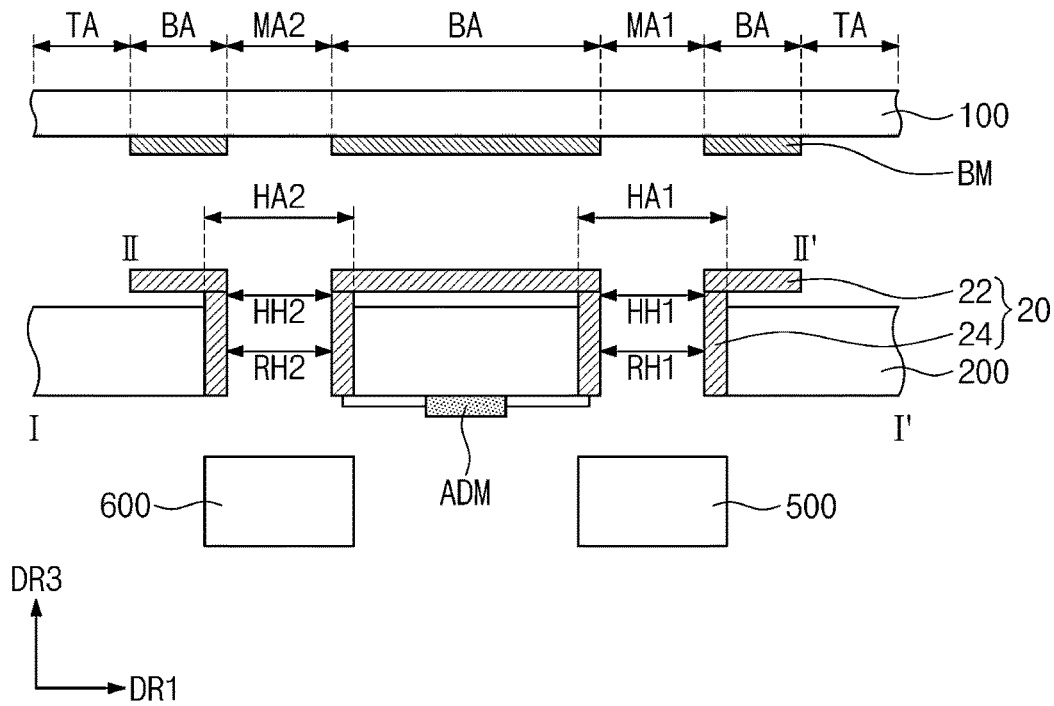
FIG. 10 is a cross-sectional view showing an embodiment of an electronic apparatus according to the invention.

FIG. 10 is a cross-sectional view showing an embodiment of an electronic apparatus according to the invention.

Referring to FIG. 10, a display module 200 may include an upper surface facing a window 100 and a lower surface opposite to the upper surface. The electronic apparatus EA may further include an antenna driving module ADM. The antenna driving module ADM may be connected to an antenna module 20. The antenna driving module ADM may be connected to a transmission line 14 (refer to FIGS. 7A and 7B) of the antenna module 20. In an embodiment, the antenna driving module ADM may be connected to a first transmission line and a second transmission line, for example. The antenna module 20 may be connected to the antenna driving module ADM to transmit and receive electrical signals related to the driving operation to and from the antenna driving module ADM or may be connected to a control module CM to transmit and receive electrical signals related to the driving operation to and from the control module CM.

In the embodiment, the antenna driving module ADM may be disposed on the lower surface of the display module 200. The antenna driving module ADM may be disposed between a first through hole HA1 and a second through hole HA2.

In the embodiment, a first portion 22 may be spaced apart from the display module 200 in a third direction DR3. The third direction DR3 may correspond to a thickness direction. The first portion 22 may not be in contact with the upper surface of the display module 200. As the first portion 22 is spaced apart from the display module 200, a signal interference may be prevented. A second portion 24 may support the first portion 22 and may extend to be inserted into a through hole.

Figure 11:
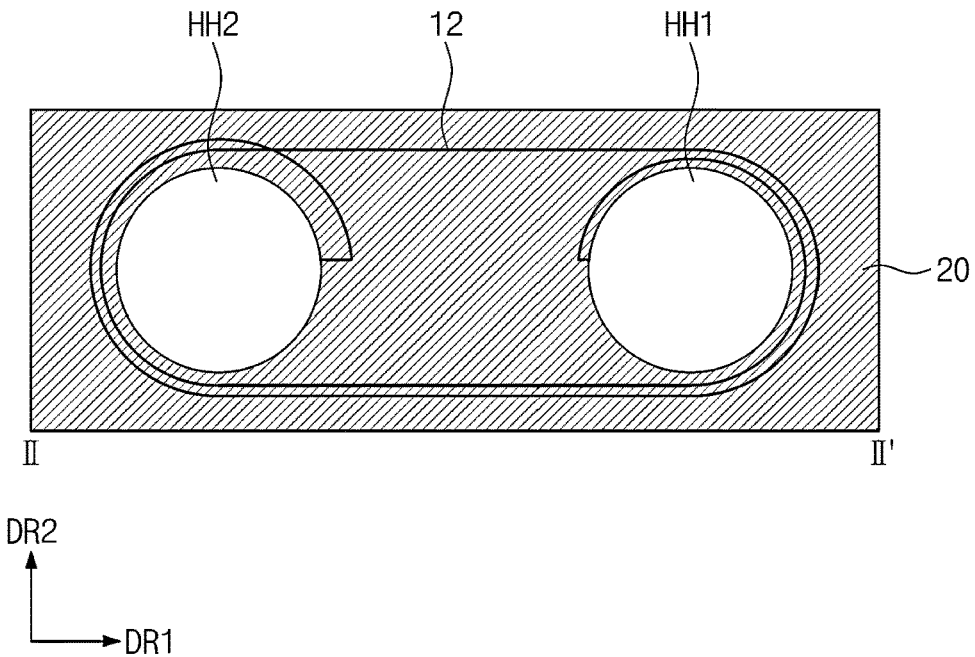
FIG. 11 is a plan view showing an embodiment of an antenna module according to the invention.

FIG. 11 is a plan view showing an embodiment of an antenna module according to the invention.

Referring to FIG. 11, a radio frequency element 12 may be disposed in a circular shape to surround first and second openings HH1 and HH2. The radio frequency element 12 may include a circular-loop antenna that is wound twice, however, it should not be limited thereto or thereby. The radio frequency element 12 may include a circular-loop antenna that is wound three or more times. The circular-loop antenna may surround the first and second openings HH1 and HH2, one end of the circular-loop antenna may extend to the first opening HH1, and the other end of the circular-loop antenna may extend to the second opening HH2. Although not shown in drawing figures, the one end and the other end of the radio frequency element 12 extending to the first opening HH1 and the second opening HH2 may be inserted into first and second through holes HA1 and HA2 and may be connected to a transmission line.

Figure 12:
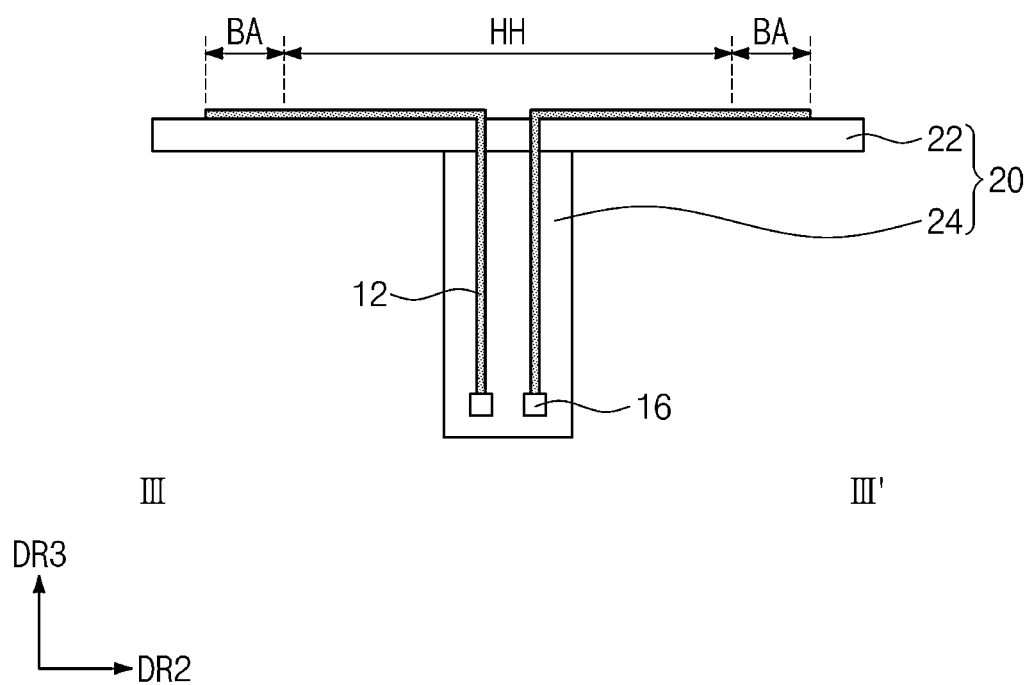
FIG. 12 is a cross-sectional view showing an embodiment of an antenna module according to the invention.

FIG. 12 is a cross-sectional view showing an embodiment of an antenna module 20 according to the invention.

Referring to FIG. 12, the antenna module 20 may include a radio frequency element 12 disposed on a first portion 22. The radio frequency element 12 may extend to a second portion 24. The radio frequency element 12 may extend to the second portion 24 and may be inserted into a through hole. The radio frequency element 12 disposed in the through hole HA may be connected to a pad 16. The antenna module 20 may include the radio frequency element 12 in the through hole HA in addition to a transmission line.

Although the embodiments of the invention have been described, it is understood that the invention should not be limited to these embodiments but various changes and modifications may be made by one ordinary skilled in the art within the spirit and scope of the invention as hereinafter claimed. Therefore, the disclosed subject matter should not be limited to any single embodiment described herein.

What is claimed is:

1. An electronic apparatus comprising:
a display module comprising a display area through which an image is displayed and a non-display area adjacent to the display area and provided with a through hole through which a signal is transmitted, which is defined in the display area;
an electronic module disposed under the display module, overlapping the through hole, and transmitting or receiving the signal; and
an antenna module disposed on the display module and comprising:
a first portion through which an opening corresponding to the through hole is defined; and
a second portion extending from the first portion and inserted into the through hole.

2. The electronic apparatus of claim 1, wherein a circular hole overlapping the opening is defined in the second portion.

3. The electronic apparatus of claim 1, wherein the second portion extends along a sidewall of the through hole by a length in a thickness direction of the display module.

4. The electronic apparatus of claim 1, wherein the antenna module comprises:
a radio frequency element disposed on the first portion; and
a transmission line disposed on the second portion.

5. The electronic apparatus of claim 4, wherein the radio frequency element comprises a loop antenna which surrounds the opening, and opposite ends of the loop antenna are connected to the transmission line.

6. The electronic apparatus of claim 1, wherein the antenna module comprises a loop antenna which surrounds the opening, and the loop antenna is disposed on the first portion and extends to the second portion.

7. The electronic apparatus of claim 1, further comprising a window disposed on the display module and comprising a transmission area corresponding to the display area and a bezel area corresponding to the non-display area.

8. The electronic apparatus of claim 7, wherein the window comprises a surface facing the display module and defining a signal transmission area overlapping the through hole, and a light blocking pattern is disposed on the surface of the window.

9. The electronic apparatus of claim 8, wherein the first portion overlaps the light blocking pattern.

10. The electronic apparatus of claim 8, wherein the second portion overlaps a portion of the light blocking pattern in a plan view.

11. The electronic apparatus of claim 1, wherein the first portion is spaced apart from the display module in a thickness direction.

12. An electronic apparatus comprising:
a window;
a display module comprising a display area through which an image is displayed and a non-display area adjacent to the display area and provided with a plurality of through holes through which a signal is transmitted, which is defined in the display area;
an electronic module disposed under the display module, overlapping the plurality of through holes, and transmitting or receiving the signal; and
an antenna module disposed between the display module and the window and comprising a radio frequency element which overlaps at least a portion of a plurality of openings defined respectively corresponding to the plurality of through holes and a transmission line extending from the radio frequency element and inserted into the plurality of through holes.

13. The electronic apparatus of claim 12, wherein the window comprises a light blocking pattern which defines a plurality of signal transmission areas respectively overlapping the plurality of through holes, and the radio frequency element overlaps the light blocking pattern.

14. The electronic apparatus of claim 12, wherein the radio frequency element comprises a loop antenna which surrounds at least a portion of the plurality of openings.

15. The electronic apparatus of claim 12, wherein the radio frequency element comprises a first radio frequency element and a second radio frequency element, and the transmission line comprises a first transmission line extending from the first radio frequency element and a second transmission line extending from the second radio frequency element.

16. The electronic apparatus of claim 15, wherein the first radio frequency element and the second radio frequency element have different frequency bands from each other.

17. The electronic apparatus of claim 15, further comprising an antenna driving module which connects the first transmission line and the second transmission line.

18. The electronic apparatus of claim 17, wherein the display module comprises a first surface facing the window and a second surface opposite to the first surface, and the antenna driving module is disposed between the plurality of through holes on the second surface.

19. The electronic apparatus of claim 12, wherein the plurality of openings comprise a first opening and a second opening, the radio frequency element comprises a loop antenna which surrounds the first and second openings, a first end of the loop antenna extends to the first opening, and a second end of the loop antenna extends to the second opening.

* * * * *